(12) United States Patent
Magni

(10) Patent No.: US 6,281,566 B1
(45) Date of Patent: *Aug. 28, 2001

(54) PLASTIC PACKAGE FOR ELECTRONIC DEVICES

(75) Inventor: Pierangelo Magni, Villasanta (IT)

(73) Assignee: SGS-Thomson Microelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/936,401

(22) Filed: Sep. 25, 1997

(30) Foreign Application Priority Data

Sep. 30, 1996 (EP) .................................................. 96830489

(51) Int. Cl.$^7$ ........................... H01L 23/495; H01L 23/28
(52) U.S. Cl. ......................... 257/666; 257/669; 257/676; 257/787
(58) Field of Search .................................. 257/666, 669, 257/676, 787

(56) References Cited

U.S. PATENT DOCUMENTS

| | | | |
|---|---|---|---|
| 5,021,864 | * | 6/1991 | Kelly et al. ........................... 257/676 |
| 5,233,222 | | 8/1993 | Diennas et al. ....................... 257/676 |
| 5,521,428 | * | 5/1996 | Hollingsworth et al. ............. 257/670 |

FOREIGN PATENT DOCUMENTS

| | | | |
|---|---|---|---|
| 0 677 873 | | 10/1995 | (EP) .............................. H01L/23/49 |
| 3163859 | * | 7/1991 | (JP) ..................................... 257/669 |
| 6-29445 | * | 2/1994 | (JP) . |
| 6-85151 | * | 3/1994 | (JP) ..................................... 257/676 |

OTHER PUBLICATIONS

Patent Abstracts of Japan, vol. 013, No. 476 (E–837), Oct. 16, 1989 & JP–A–01 187841 (Hitachi Ltd.).

Patent Abstracts of Japan, vol. 018, No. 336 (E–1568), Jun. 24, 1994 & JP–A–06 085151 (Seiko Epson Corp.).

* cited by examiner

Primary Examiner—David E. Graybill
(74) Attorney, Agent, or Firm—Wolf, Greenfield & Sacks, P.C.; James H. Morris; Theodore E. Galanthay

(57) ABSTRACT

A semiconductor electronic device comprises a chip of a semiconductor material, a set of metal conductors adjacent to the plate, a set of wire leads joining selected points on the chip to the metal conductors, and a supporting metal plate formed of three portions having a total surface area which is substantially less than the surface area of the chip, and forming a H-shaped supporting structure. All this, except the ends of the metal conductors, is encapsulated within a plastic material body.

25 Claims, 4 Drawing Sheets

PLASTIC PACKAGE FOR ELECTRONIC DEVICES

BACKGROUND OF THE INVENTION

1. Field of the Invention

This invention relates to a semiconductor electronic device, and more particularly, to plastic cases for surface-mount integrated circuits of the thin type.

2. Discussion of the Related Art

As is known, a plastic case, or package, of the surface-mount thin type comprises a supporting plate for a chip of a semiconductor material, most commonly silicon, a plurality of rigid metal conductors connected electrically to selected areas of the chip by small-gauge wire leads, and a body of plastic, usually an epoxy resin, which encapsulates everything but the ends of the metal conductors that form the device rheophores. The rheophores are then bent with their ends lying in a common plane, which plane is substantially the plane of one of the major surfaces of the plastic body.

A recent trend in plastics cases of this type has been toward decreasing thickness, changing from 3–4 mm for the packages of some years ago to 1.4 or 1 mm and even less for current packages.

The supporting plate and metal conductors are formed, usually by a blanking process, from a single strip of sheet metal, as can be seen in FIG. 1. This FIG. shows a sheet metal piece 1 from which supporting plate 2 and two sets of metal conductors 3 and 4 have been formed, each adjacent to one side of the plate. The structure denoted by 1 is called a leadframe, and in general, includes a number of plate/conductor elements.

The metal plate 2 is rectangular in shape and its dimensions are approximately the same as those of the chip received thereon. In addition, this plate is slightly sunken with respect to the plane of the metal conductors 3 and 4, such that the chip can be located centrally in the plastic case, thereby minimizing the package warping on cooling. Warpage is a frequent occurrence with ultra-thin packages, since the different thermal expansion coefficients of the resin, silicon and metal materials may cause the structure to distort out of plane, unless it is made symmetrical. The chip is secured on the plate by means of a special adhesive, and the metal conductors on the leadframe are connected to selected areas on the chip by thin wire leads.

FIG. 2 shows a mold as used for forming the plastics case. This mold is a split type with an upper mold half 10 and a lower mold half 11, each having a corresponding hollow. The two mold halves are oriented with their hollows facing each other, thereby defining a mold cavity into which the resin will be injected. The portion of the leadframe that is to be encapsulated within the resin is clamped between the mold halves. A synthetic resin 20, e.g. an epoxy resin, is injected into the mold 12 at an elevated temperature through a gate 12.

This process is best illustrated by FIGS. 3, 4, 5 and 6, which FIG.s also highlight some more problems besetting this molding process. As shown particularly in FIG. 4, the resin flows from the gate 12, parts along two paths, one to the upper part of the mold and the other to the lower part. The cross-section of the upper part is larger than that of the lower part; consequently, the resistance met by the resin flow in this part will be less, and the resin flow will be faster and reach the right end of the mold in less time. After reaching the mold end, the resin begins to flow toward the lower part of the mold, as shown in FIG. 5, where there still is space unoccupied, and air becomes trapped 21 at a location from which it cannot be removed.

This occurs particularly in the center region of the package, as shown in FIG. 7, because the velocity of the resin flow admitted centrally through the gate 12 is high along the two sides of the mold and low in the center region. Thus, faults may develop in the package due to trapped air that will unavoidably make a reject of it.

A third problem with packages of this type is related to assembling the devices on the printed circuit boards. For surface mounting, the devices are welded to the printed circuit tracks using a process at a relatively high temperature, typically in the 200 to 250 degrees centigrade, and of relatively long duration (a few tens of seconds). It has been found that this process originates phenomena within the plastics body which affect the physical characteristics and mechanical stability of the package. In particular, with a small ratio of the plastics body thickness to the surface area of the supporting metal plate, tied to the chip dimensions, these effects may result in case rupture.

This phenomenon is known to those skilled in the art as the "pop-corn effect." One theory advanced as to the pop-corn effect follows. Water is absorbed by the resin from the environment and is present in the adhesive used to join the chip to the plate. The water migrates toward the outer and inner surfaces of the body. If the adhesion of the plastics body to the parts encapsulated therein is less than perfect or fails because of the different expansions of the materials during the thermal cycle, a void may be formed between the plastic and the chip and between the plastic and the underside of the supporting plate, wherein water can settle. Due to the high temperatures used in welding, the water is vaporized and exerts pressure against the walls of the void. The vapor pressure within the body distorts the package walls, and may ultimately rupture them.

To obviate the destructive effect just described, various measures have been suggested, including removing the absorbed water by baking the parts prior to the welding process, protecting the parts during storage so as to prevent water absorption, and improving the adhesion of the resin to the device components within the body by chemical or mechanical treatment of the supporting plate surface.

All of the measures listed above show more or less serious drawbacks and involve additional processing of considerable cost and difficulty. In view of the current manufacturing trend toward integrated circuits of growing complexity, and accordingly toward the use of chips of increasing size, albeit without increasing the package size, it will be appreciated that the above-described phenomena represent a serious problem in that they restrict the possibility of using certain standard packages.

The underlying technical problem of this invention is to provide a supporting plate having such construction and performance features as to enable a semiconductor electronic device to be mounted within a case of the type outlined above, and which is particularly resistant to the degenerative effects of the welding process and involves no costly alterations of the fabrication process, thereby overcoming the aforementioned limitations of the prior art.

SUMMARY OF THE INVENTION

The present invention provides a plastic case for surface mount integrated circuits of the thin type, which includes three major portions arranged in an H-shaped structure, supporting the semiconductor material chip along two of its sides and at a center portion. In one embodiment the center portion is flexible, thereby relieving stresses due to varying material coefficients of expansion, allowing the structure to retain elasticity, and preventing stress related defects.

The features of this invention will be more clearly apparent from the following detailed description of embodiments thereof, shown by way of non-limitative example in the accompanying drawings.

DETAILED DESCRIPTION

Figure 1:
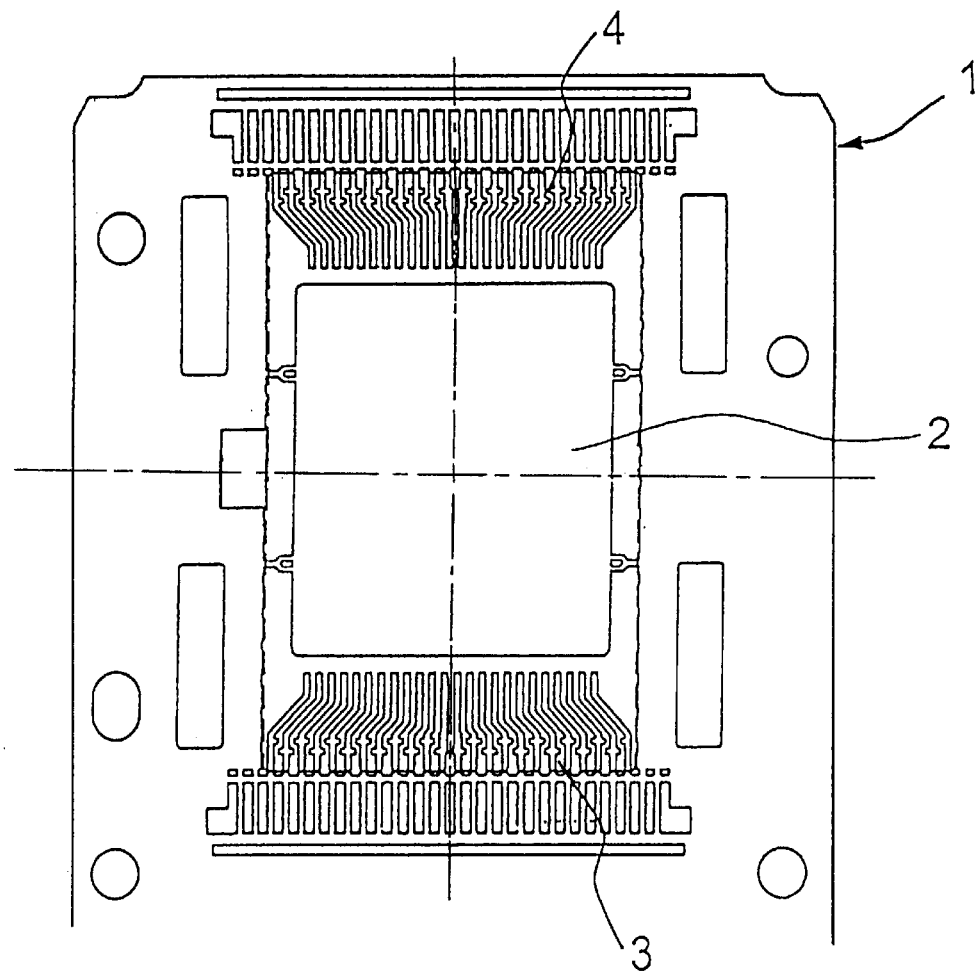
FIG. 1 is an enlarged view of a portion of a sheet metal strip as blanked to a conventional pattern.
Figure 2:
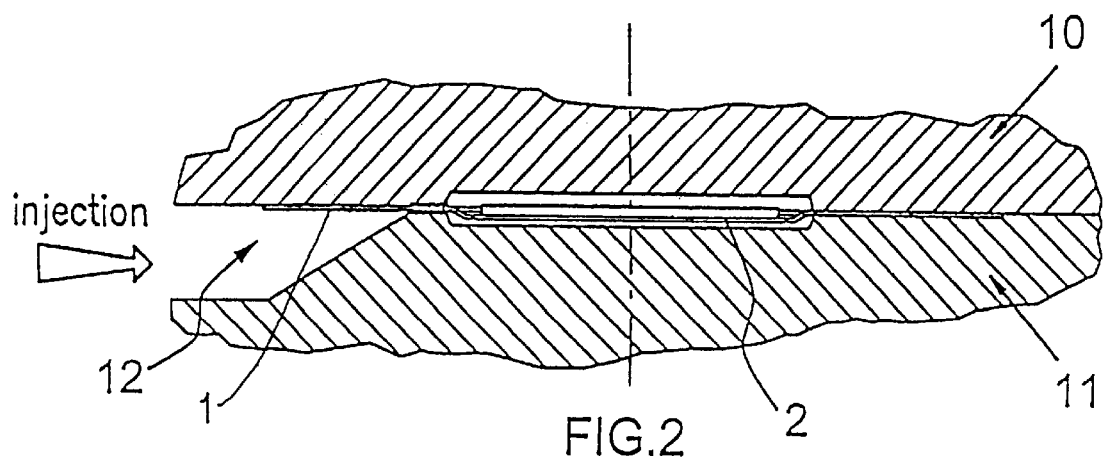
FIG. 2 is a sectional view of a mold for molding a plastic case.
Figure 3:
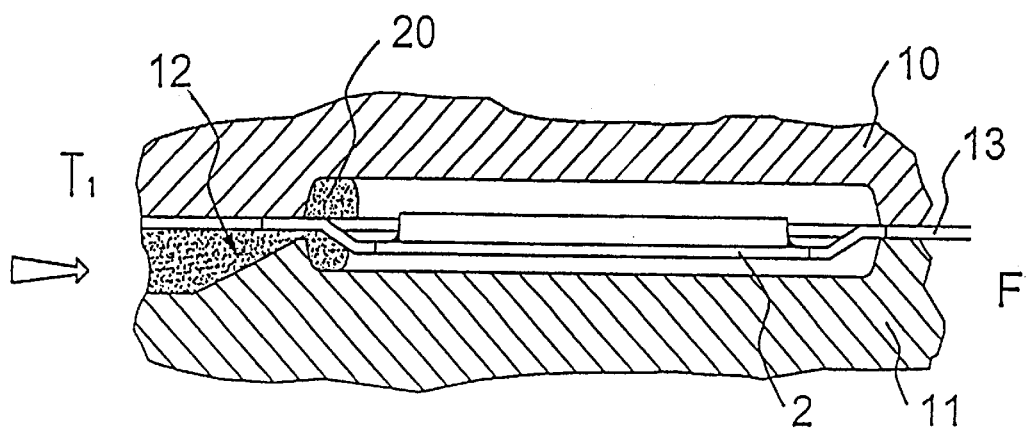
FIG. 3 is a sectional view illustrating a step in the molding of a conventional plastic case, in which a resin is injected into the case.
Figure 4:
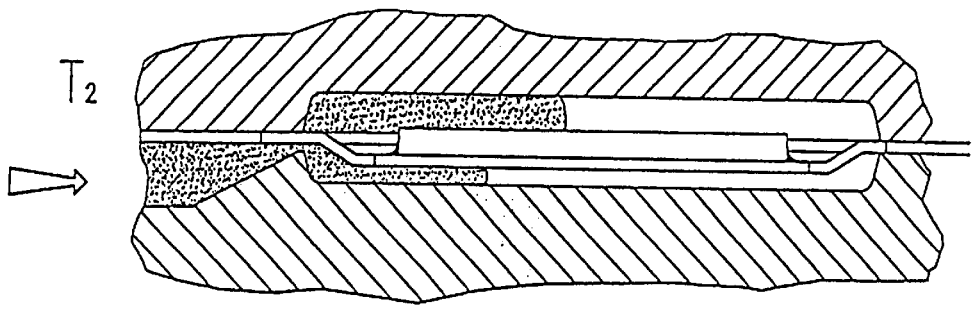
FIG. 4 illustrates the resin of FIG. 3 advancing through the upper part of the mold.
Figure 5:
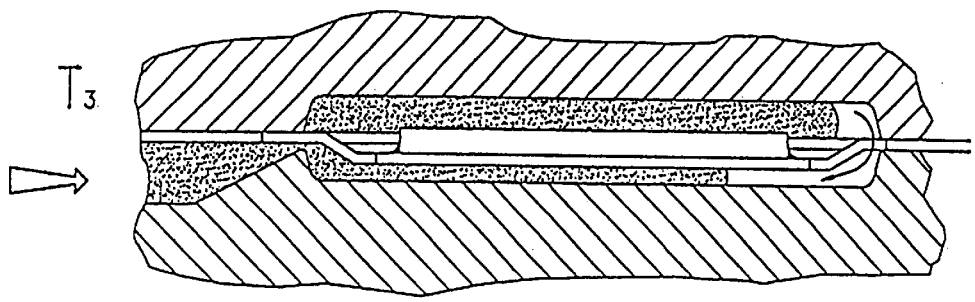
FIG. 5 illustrates the resin of FIG. 3 flowing from the upper to the lower part of the mold.
Figure 6:
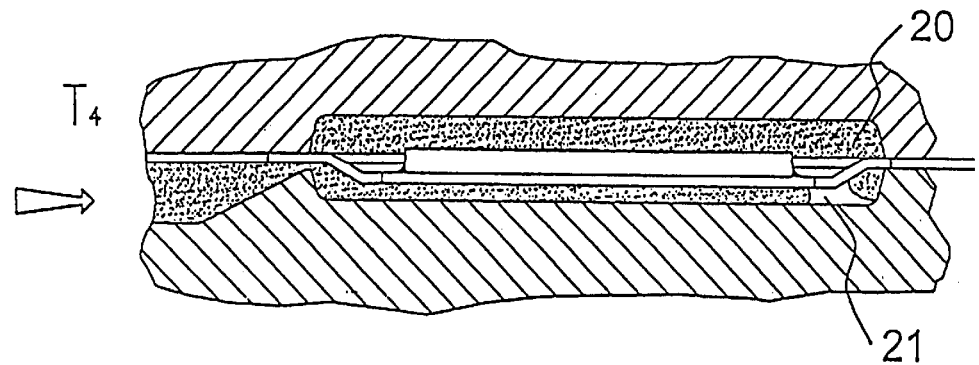
FIG. 6 illustrates air trapped in the plastic case.
Figure 7:
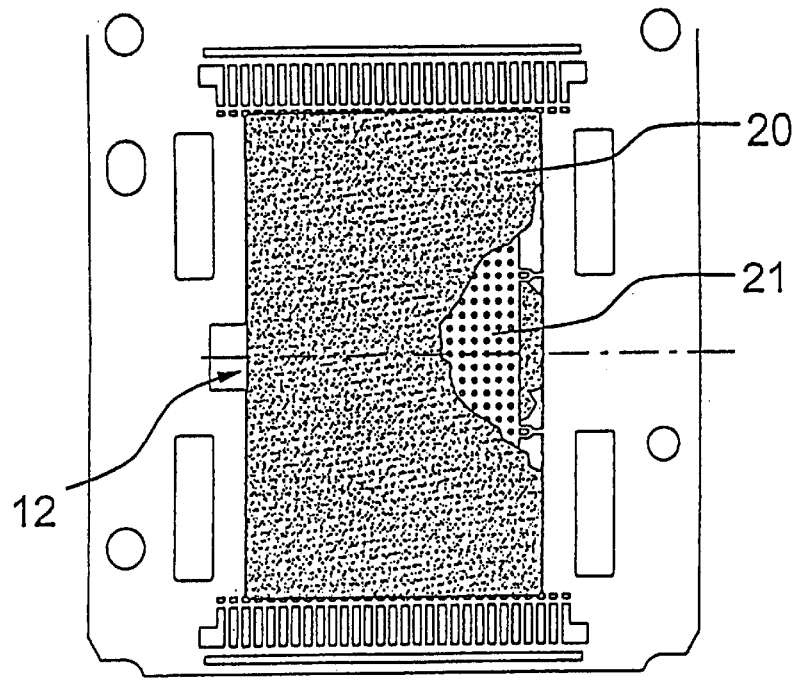
FIG. 7 shows a molding defect in a conventional plastic case.
Figure 8:
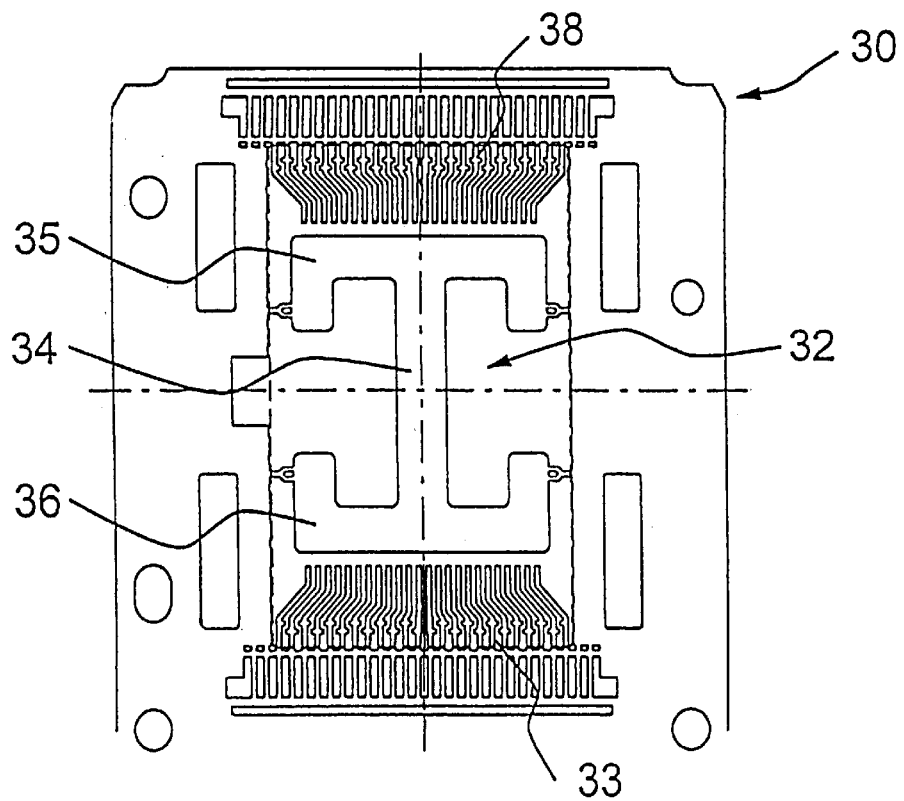
FIG. 8 is an enlarged view of a sheet metal strip incorporating a blanked supporting plate according to the invention.

With reference to the drawings, the supporting structure 30 in FIG. 8 forms the termination end of a leadframe. In particular, the plate 32 comprises three major portions, indicated at 34, 35, 36, which are arranged into a H-shaped structure. This structure supports the semiconductor material chip along two of its sides and at a center portion, and has an overall surface area which amounts to about 50% of the chip surface area. A first portion 35 and a second portion 36 of the plate extend along two opposite sides of the chip, and a third portion 34 joins them at the middle. Conveniently, the first and second portions have on their ends, located at the chip corners, small extensions jutting perpendicularly inwards of the chip, thereby to form a support under each corner of the chip. The plate 32 and metal conductors 33, 38 are blanked off a single piece of sheet metal by conventional techniques. The subsequent fabrication steps of the device are common ones for packages of this type. In particular, they include: welding the chip, as suitably processed to provide an integrated circuit, on the supporting plate 32; welding thin wires to the metal conductors 33 and 38 and to specific metallized areas of the chip which constitute the electric terminals of the integrated circuit; forming an encapsulating body of plastics by injecting a heat-setting epoxy resin under pressure into a suitable mold; and cutting the sheet metal portions that hold together the metal conductors, outside the plastics case.

The region below the chip unoccupied by the supporting plate is filled with resin during the molding operation. As a result, the volume of the empty portion in the lower mold will be larger than in the instance of a conventional device by a factor which is proportional to the gauge of the sheet metal used for the leadframe. This causes the resin flow velocity to be nearly the same through the upper and lower molds, so that no air can become trapped within the mold cavity. Furthermore, the amount of adhesive used for securing the chip on the plate is one half that used for a conventional device with a rectangular plate. This effectively lowers the rate of defects from water collected within the adhesive.

Figure 9:
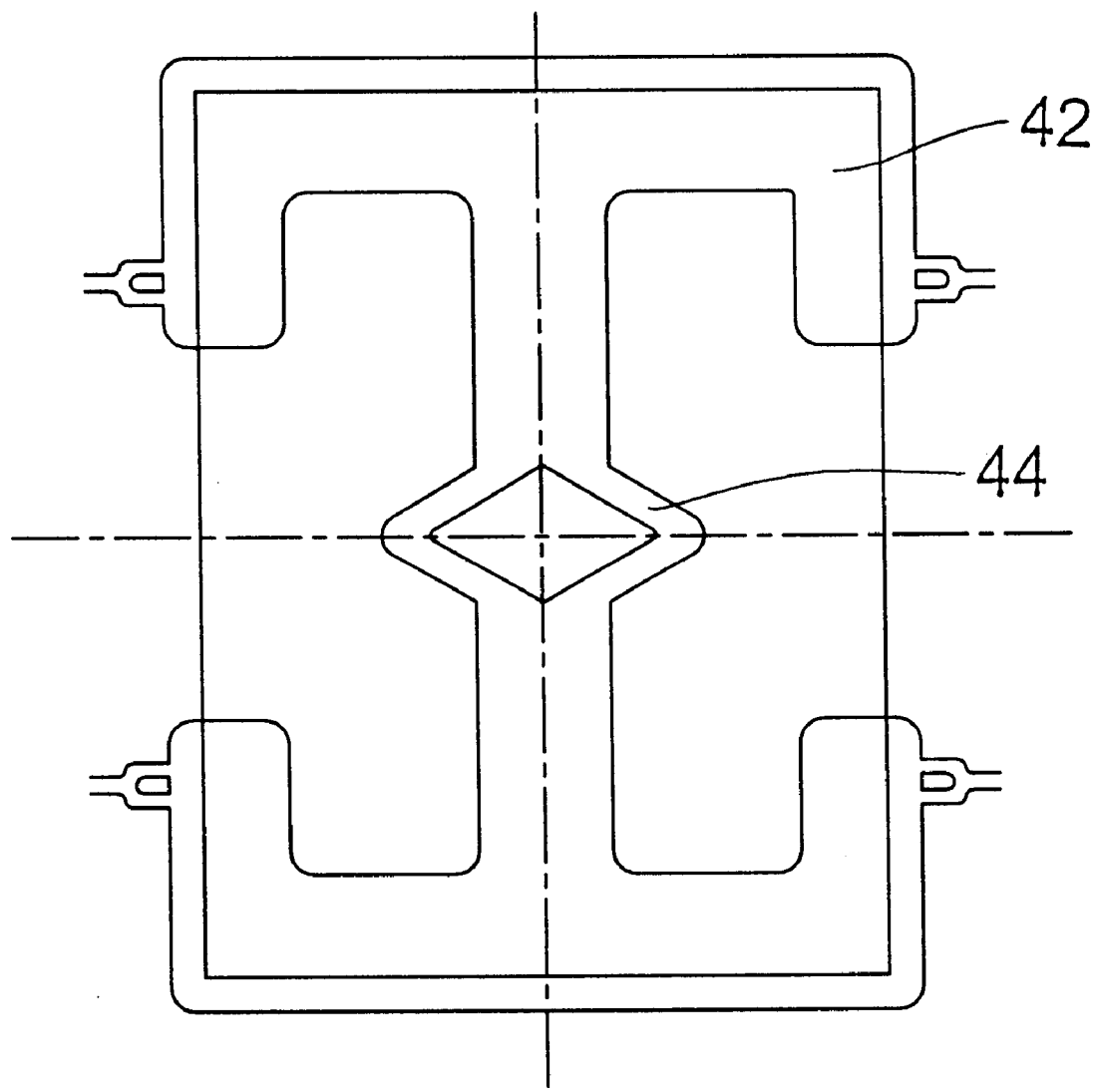
FIG. 9 is an enlarged view of a modified embodiment of a blanked supporting plate according to the invention.

Another embodiment of the inventive device is shown in FIG. 9. In particular, a supporting plate 42 is shown which has a modified central portion 44. The central portion of the plate includes an elastic center portion 44 which allows for partial elongation of the structure in the longitudinal direction of the central portion, which direction corresponds to the major axis of the chip. The elastic center portion 44 is formed by a trapezoid-shaped enlargement on whose inside an opening is formed, also trapezoidal in shape.

This expedient confers some elasticity on the supporting plate, which affords partial compensation of the internal stresses to the device structure due to the different coefficients of expansion of the materials employed. Advantageously, to retain the structure own elasticity, the elastic portion 44 is adhesively unattached to the chip.

It is noteworthy that the device of this invention has a unique advantage in that it requires no modifications to the fabrication process.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor electronic device, comprising:
   a chip of a semiconductor material having a first surface, a second surface, sides, and corners;
   a supporting metal plate for the chip, having a major surface in contact with the first surface of the chip;
   a set of metal conductors adjacent to the plate;
   a set of wire leads joining selected points on the second surface of the chip to the metal conductors;
   a body made of a plastic material which encapsulates everything but the ends of the metal conductors;
   wherein the supporting metal plate comprises a first portion and a second portion, the first and second portions each extending along an opposing side of the chip, and including an extension having a free end disposed inwardly at an end of each portion;
   wherein the supporting metal plate further includes a third portion that bisects the semiconductor material chip and joins the first and second portions together;
   wherein the third portion includes an elastic center portion which allows a partial elongation of the supporting metal plate in the longitudinal direction of the third portion.
   wherein the elastic center portion has the shape of a trapezoid.

2. The device of claim 1, wherein the length of each of the first and second portions is at least that of the opposing sides along which the first and second portions extend.

3. The device of claim 2, wherein said supporting metal plate comprises about 50 percent of the area of the first surface.

4. The device of claim 1 wherein the plate and conductors are blanked off a single piece of sheet metal.

5. The device of claim 1, wherein the trapezoid-shaped elastic portion includes a trapezoidal opening therein.

6. The device of claim 5, wherein the elastic center portion is adhesively unattached to the chip, thereby allowing said supporting metal plate to retain elasticity.

7. The device of claim 6 wherein the supporting metal plate and the conductors are blanked off a single piece of sheet metal.

8. The device of claim 1, wherein;

each extension free end has a free end face, each extension extends toward said extension free end in a direction between said opposing sides, and the free end faces of respective extensions of said first and second portions are disposed in relative facing relationship one to the other.

9. The device of claim 1, wherein said third portion extends between said first and second portions, and in a direction between said opposing sides.

10. The device of claim 8, wherein said a third portion that extends between said first and second portions, and in a direction between said opposing sides.

11. The device of claim 10, wherein each of said first and second portions has a pair of extensions, one of each pair disposed at opposite ends of respective first and second portions.

12. The device of claim 11, wherein the extensions of said pairs of extensions each have face ends with free end faces.

13. The device of claim 12, wherein the face end faces of respective pairs of extensions of said first and second portions are disposed in relative facing relationship one to the other.

14. The device of claim 1, wherein the extension is disposed extending in a direction between said opposing sides.

15. A semiconductor electronic device, comprising:

a semiconductor material chip having a first and a second surface, said first surface supported by a metal plate, said metal plate comprising a first portion and a second portion, said first and second portions each extending along opposing sides of said first surface, said first and second portions each including an extension having a free end disposed inwardly at an end of each portion, and said metal supporting plate constructed and arranged to allow a resin to uniformly flow around said chip when said chip is positioned in a mold, so as to provide a substantially void-free plastic encapsulation of said chip and said metal supporting plate;

wherein the metal plate further includes a third portion that bisects the semiconductor material chip and joins the first and second portions together;

wherein the length of each of the first and second portions is at least that of the opposing sides along which the first and second portions extend;

wherein said supporting metal plate comprises about 50 percent of the area of the first surface;

wherein the third portion includes an elastic center portion which allows a partial elongation of the supporting metal plate in the longitudinal direction of the third portion;

wherein the elastic center portion has the shape of a trapezoid.

16. The device of claim 15, wherein said metal plate is constructed and arranged to provide partial compensation of internal stresses in said encapsulated device which are due to varying material coefficients of expansion.

17. The device of claim 15, wherein the plate and conductors are blanked off a single piece of sheet metal.

18. The device of claims 17, wherein the elastic center portion is adhesively unattached to the chip, thereby allowing said supporting metal plate to retain elasticity.

19. The device of claim 18, wherein the supporting metal plate and the conductors are blanked off a single piece of sheet metal.

20. The device of claim 15, wherein;

each extension free end has a free end face, each extension extends toward said extension free end in a direction between said opposing sides, and the free end faces of respective extensions of said first and second portions are disposed in relative facing relationship one to the other.

21. The device of claim 20, wherein said third portion extends between said first and second portions, and in a direction between said opposing sides.

22. The device of claim 21, wherein each of said first and second portions has a pair of extensions, one of each pair disposed at opposite ends of respective first and second portions.

23. The device of claim 22, wherein the extensions of said pairs of extensions each have face ends with free end faces.

24. The device of claim 23, wherein the face end faces of respective pairs of extensions of said first and second portions are disposed in relative facing relationship one to the other.

25. The device of claim 15, wherein the extension is disposed extending in a direction between said opposing sides.

* * * * *